United States Patent
Schmitt (10) Patent No.: US 6,498,898 B2
(45) Date of Patent: Dec. 24, 2002

(54) UNIFORM HEAT TRACE AND SECONDARY CONTAINMENT FOR DELIVERY LINES FOR PROCESSING SYSTEM

(75) Inventor: John V. Schmitt, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/757,731

(22) Filed: Jan. 9, 2001

(65) Prior Publication Data

US 2001/0006071 A1 Jul. 5, 2001

Related U.S. Application Data

(62) Division of application No. 09/034,522, filed on Mar. 3, 1998, now Pat. No. 6,202,656.

(51) Int. Cl.[7] .............................................. A47J 31/00
(52) U.S. Cl. ....................... 392/466; 392/496; 134/107
(58) Field of Search ................................ 392/466, 496; 134/108, 107, 105; 165/154

(56) References Cited

U.S. PATENT DOCUMENTS

| | | | |
|---|---|---|---|
| 383,536 A | 5/1888 | Newman | |
| 2,259,433 A | 10/1941 | Kitto | ........................ 29/157.3 |
| 2,475,635 A | 7/1949 | Parsons | ........................ 138/65 |
| 2,949,119 A | 8/1960 | Smith | ........................ 134/60 |
| 3,471,372 A | 10/1969 | Dunn, Jr. | ..................... 202/170 |

(List continued on next page.)

FOREIGN PATENT DOCUMENTS

| | | | |
|---|---|---|---|
| EP | 0 864 827 A1 | 9/1998 | ............. F25D/1/02 |
| JP | 61-278700 | 12/1986 | ............. F17D/5/02 |
| JP | 63-151347 | 6/1988 | ............... B01J/4/00 |
| JP | 05-085890 | 4/1993 | ........... C30B/25/14 |
| JP | 09-269087 | 10/1997 | ............. F16L/9/18 |

OTHER PUBLICATIONS

"Series 45 Vacuum Piping Heaters for Semiconductor Processes", MKS Instruments, Bulletin 7/97.

(List continued on next page.)

*Primary Examiner*—Teresa Walberg
*Assistant Examiner*—Thor Campbell
(74) *Attorney, Agent, or Firm*—Moser, Patterson & Sheridan

(57) ABSTRACT

A fluid delivery system for delivering a process fluid to a vacuum processing system includes a secondary containment line surrounding a process fluid line. A purge gas flows through the secondary containment line and around the process fluid line in order to flow away any leaked process fluid. Alternatively, a heated fluid flows through the secondary containment line forming a heat trace around the process fluid line to heat the process fluid line and the process fluid by means of convection, which provides for precise uniformity of temperature throughout the length of the secondary containment line. The heated fluid loses heat to the ambient environment creating a temperature gradient through which the process fluid flows. The secondary containment line may have a heating element along its length for adding heat to the heated fluid to change the temperature gradient.

Two semicircular cylindrical sections fit together to form a fully circular section of the secondary containment line for covering a straight portion of the process fluid line. The secondary containment line also includes sections for covering angled sections, intersections, valve sections and other discontinuous sections of the process fluid line.

In another embodiment, the heat trace includes a shell surrounding the process fluid line and in thermal contact therewith, and the shell has longitudinal holes through which cable heaters are disposed along the length of the process fluid line. Thermocouples are disposed along the length of the heat trace and provide temperature feedback to a controller that controls the amount of heat generated by the cable heaters.

14 Claims, 7 Drawing Sheets

U.S. PATENT DOCUMENTS

| | | | |
|---|---|---|---|
| 3,506,039 A | 4/1970 | Marriott | 138/114 |
| 4,062,376 A | 12/1977 | McGrath | 137/312 |
| 4,157,194 A | 6/1979 | Takahashi | 285/3 |
| 4,256,170 A | 3/1981 | Crump | 165/1 |
| 4,461,347 A | 7/1984 | Layton et al. | 165/133 |
| 4,497,365 A | 2/1985 | Boyer | 165/164 |
| 4,834,137 A | 5/1989 | Kawaguchi et al. | 137/557 |
| 4,836,237 A | 6/1989 | McCullough | 137/312 |
| 4,932,353 A | 6/1990 | Kawata et al. | 118/302 |
| 4,960,167 A | 10/1990 | Stenlund | 165/40 |
| 4,980,017 A | 12/1990 | Kaji et al. | 156/642 |
| 5,082,517 A | 1/1992 | Moslehi | 156/345 |
| 5,120,370 A | 6/1992 | Mori et al. | 134/22.15 |
| 5,496,410 A | 3/1996 | Fukuda et al. | 118/723 MW |
| 5,522,453 A | 6/1996 | Green | 165/41 |
| 5,640,748 A | 6/1997 | Harrison | 29/272 |
| 5,687,993 A | 11/1997 | Brim | 285/131 |
| 5,728,222 A | 3/1998 | Barbee et al. | 118/715 |

OTHER PUBLICATIONS

"Vapor Sublimation Trap for Semiconductor Processes", MKS INstruments, Bulletin 7/97.

"Heated Pump Lines Eliminate Condensable Effluent Contamination", MKS Instruments, Fab Bulletin 96.3–5/96.

"VacuComp™ Series 170/180 Heated Vacuum Valves", MKS Instruments, Bulletin 2/97, Series 170/180.

"High Accuracy Pressure Measurement Product Selection Guide", MKS Instruments, Bulletin HASG–3/97.

UNIFORM HEAT TRACE AND SECONDARY CONTAINMENT FOR DELIVERY LINES FOR PROCESSING SYSTEM

This is a divisional of application(s) Ser. No. 09/034,522 filed on Mar. 3, 1998 now U.S. Pat. No. 6,202,656.

FIELD OF THE INVENTION

The present invention generally relates to methods and apparatuses for delivery of fluids in a processing system used for the fabrication of integrated circuits and flat panel displays. Specifically, the present invention relates to methods and apparatuses for heating fluid delivery lines in a vacuum processing system in order to heat the fluid flowing therein and for containing fluid leaked from the fluid delivery lines.

BACKGROUND OF THE INVENTION

Vacuum processing systems for processing 100 mm, 200 mm, 300 mm or other diameter wafers are generally known. Typically, such vacuum processing systems have a centralized transfer chamber mounted on a monolith platform. The transfer chamber is the center of activity for the movement of substrates being processed in the system. One or more process chambers and load lock chambers mount on the transfer chamber, and a transfer chamber robot mounts in the middle of the transfer chamber to access each of the process chambers and load lock chambers to transfer a substrate therebetween. Different process chambers perform different processes on the substrates. For example, a physical vapor deposition (PVD) chamber or a chemical vapor deposition (CVD) chamber may deposit a layer of material, such as a conductor or an insulator, onto the surface of the substrate; or an etch chamber may remove a layer of material from parts of the surface of the substrate; or an ion implantation chamber may implant ion dopants into the substrate; or a pre-clean chamber may remove a layer of the substrate contaminated with oxides; or a thermal processing chamber may heat a substrate to cure or anneal the substrate after a previous process. In fact, it is not uncommon for a manufacturer of semiconductor processing systems to provide over twenty different types of process chambers. Access to the transfer chamber from the clean ambient environment is typically through the load lock chambers. The load lock chambers may open to a very clean room, referred to as the white area, or to a substrate handling chamber, typically referred to as a mini-environment, for transferring substrates in a very clean environment at atmospheric pressure from pods seated on pod loaders to the load lock chambers.

Each type of process chamber typically performs one specific step or series of steps in the overall fabrication of integrated circuits or flat panel displays. For example, some types of process chambers specifically deposit one particular material onto the surface of the wafer. Other types of process chambers specifically etch away a particular layer from the surface of the wafer. Still other types of process chambers specifically implant a particular ion into the wafer.

Many of these processes require that certain gases or liquids be delivered to the process chamber to perform the process. These gases and liquids are commonly called process fluids and are delivered to the process chambers through fluid delivery lines from sources of the fluids in the manufacturing plant. For example, a chemical vapor deposition process of copper may require cupraselect, a metal organic compound, be provided as a precursor in the process. Another process may use dimethylaluminumhydride (DMAH) to perform chemical vapor deposition of aluminum. Yet another process may use tetrakisdimethylaminotitanium (TDMAT) to deposit a film of titanium nitride on a wafer. Still another process may use barium and strontium precursors to deposit a film of barium strontium titanate (BST). The process fluids are typically converted into a gaseous state by vaporization, bubbling or other appropriate process to deliver a vapor of the process fluid to the process chamber.

Many of these process fluids must be maintained within a specific temperature range while flowing through the fluid lines to prevent deposits along the path. Also, many of these process fluids are toxic, pyrophoric, corrosive, or otherwise hazardous, so special safeguards must be employed to prevent leakage of the process fluids into the ambient air.

Those process fluids that must be maintained within a particular temperature range while flowing through the fluid lines, may need to be in a gaseous state in order to flow properly through the fluid lines or to enter the process chamber in the proper concentration or condition for processing. Condensation of the process fluids may cause a loss of controllability or repeatability of the process, including a loss of accurate delivery of the process fluid from one wafer to the next or a loss of control over the amount of material deposited on a single wafer. Thus, these process fluids must be maintained above their vaporization temperature, so that they remain gaseous. Additionally, many of these process fluids are molecular compounds which may decompose, or chemically breakdown into their constituent elements or other molecules, above a certain temperature. Thus, these process fluids must be maintained below their decomposition temperature.

Some of these process fluids may have a fairly wide window between their vaporization temperature and their decomposition temperature, so that maintaining the fluid lines and the process fluid within the required temperature range may be fairly easy. Other process fluids, however, may have a narrow window between their vaporization temperature and their decomposition temperature, so that maintaining the fluid lines and the process fluid within the required temperature range may require a very tightly controlled delivery process in order to ensure that the temperature of the entire fluid delivery line does not vary. For example, cupraselect has a vaporization temperature of about 75° C. and a decomposition temperature of about 85° C. Thus, cupraselect has a very narrow temperature range within which it must be maintained for proper operation of a process that uses cupraselect. By comparison, DMAH has a vaporization temperature of about 40° C. and a decomposition temperature of about 180–200° C., and TDMAT has a vaporization temperature of about 50° C. and a decomposition temperature greater than about 300° C. Thus, these compounds present a fairly wide temperature range which is considerably less difficult to maintain than that of cupraselect.

Figure 1A:
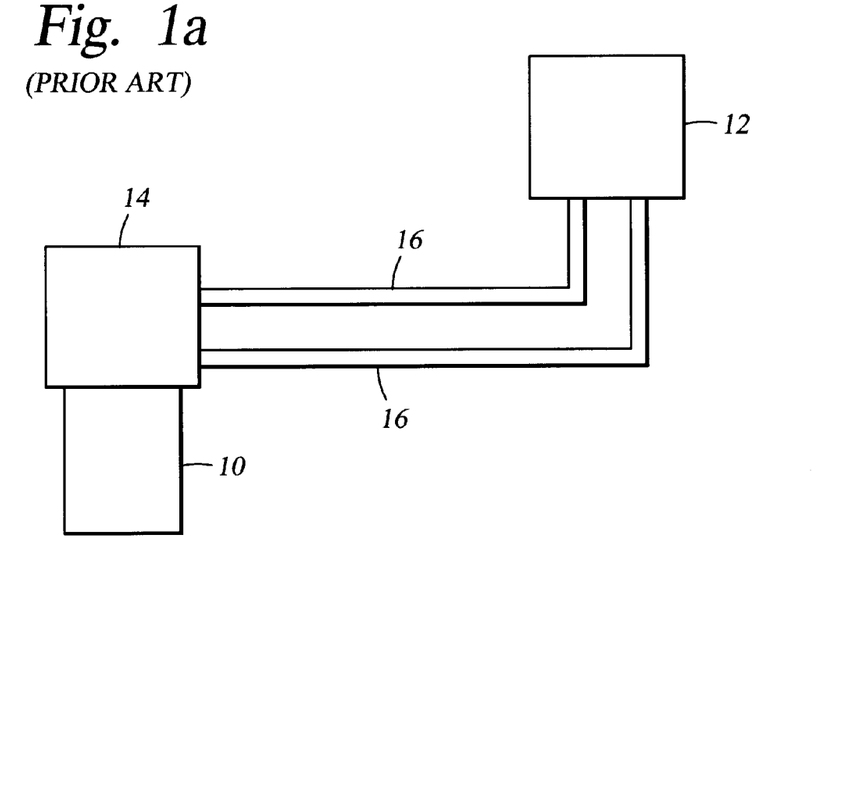
FIG. 1a is a prior art drawing of a process fluid source and process chamber with a fluid delivery system therebetween.

FIG. 1a shows a simplified schematic of a process fluid source 10, a process chamber 12 and the delivery system in between. The fluid delivery system heats the process fluid in a hot box 14 next to the source 10 prior to flowing the process fluid through the fluid lines 16 to the process chamber 12. One or more fluid lines (not shown) are attached to the process fluid source 10 and connected to a system of valves (not shown) for regulating the flow of the process fluid. These fluid lines and valves are typically housed within the hot box 14. The hot box 14 is a closed heated environment for heating the regulating valves and the fluid lines that are immediately adjacent to the fluid source 10. Thus, the process fluid enters the fluid lines 16 for delivery to the process chamber 12 within the appropriate temperature range. The hot box 14 does not heat the fluid lines 16 that deliver the process fluid to the process chamber 12.

Figure 1B:
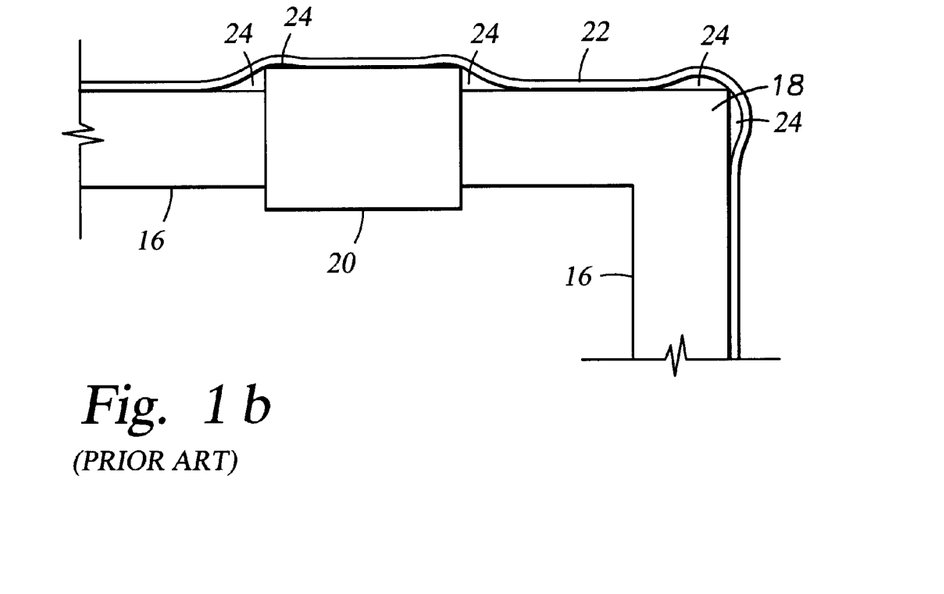
FIG. 1b is a prior art drawing of a fluid delivery line.

Since there may be several feet of fluid delivery line between the process fluid source and the process chamber, the fluid delivery line may also have to be heated. Otherwise, the process fluid may condense within the fluid lines before it reaches the process chamber and disrupt the proper functioning of the process. FIG. 1b shows a portion of a fluid delivery line 16 illustrating the means for heating the fluid line 16 between the hot box 14 and the process chamber 12. The fluid line 16 has an angled portion 18 and a section 20 that does not have the same diameter as the rest of the fluid line 16. Section 20 may be a fitting or a joint connecting two portions of the fluid line 16, or a valve section controlling the flow through the fluid line 16, or an intersection of more than one fluid line 16, or some other line section disposed in the fluid line 16 that presents an interruption in the contour of the outer surface of the fluid line 16.

A length of heating tape 22 is adhesively attached to the outer surfaces of each of the sections of the fluid line 16 between the hot box 14 and the process chamber 12. The heating tape 22 is typically a semi-flexible resistive tape that is heated with an electrical current. The heating tape 22 heats each section of the fluid line 16 in order to maintain the fluid line 16 and the process fluid within the appropriate temperature range. FIG. 1b shows the heating tape 22 attached longitudinally down the length of the fluid line 16. The heating tape 22, however, may be wrapped around the fluid line 16 in other manners as well.

A problem with the heating tape 22 is that gaps 24 frequently occur between the heating tape 22 and parts of the fluid line 16, so there is no contact therebetween at those locations. Cool spots can occur within the fluid line 16 at the location of these gaps 24, and hot spots can occur where the heating tape 22 may be concentrated. The variance in temperature may be +/−20° C., and even in a well-assembled system may be +/−10° C., very significant variances for a process gas such as cupraselect, as discussed above. If the cool spots are below the vaporization temperature of the process fluid, then the process fluid will form condensation at these cool spots inside the fluid line 16. Thus, the flow of the process fluid may be disrupted, and the system may lose control and repeatability of the performance of the process. If the operator of the system attempts to compensate for the cool spots by increasing the temperature of the heating tape 22, then the system may run the risk of exceeding the decomposition temperature of the process fluid, and the process fluid may break down into its constituent elements or other molecules, which will not perform the required process in the process chamber 12.

Another problem with the heating tape 22 is that many heat-trace applications in chemical vapor deposition rely on temperature gradients to prevent condensation throughout the fluid line 16. With the conventional heating tape 22, the temperature gradient can be created only with discontinuous steps through the fluid line 16. The discontinuous steps require separate controls for each step. A continuous temperature gradient with no additional controls would be preferable.

Those fluid lines that are delivering process fluids that are toxic, pyrophoric, corrosive, or otherwise hazardous should have a secondary containment means for capturing leaked fluid. The captured fluid needs to be safely contained and delivered to a facility for extracting or disposing of the hazardous material typically in the area of the fabrication facility commonly referred to as pump alley or in the gray area. Conventional secondary containment methods provide containment of only the volume in the straight sections of the fluid line and do not cover the fittings, joints or other discontinuities between the straight sections. However, leaks are more likely to occur at a fitting, joint, intersection, valve or other discontinuity in the fluid line than in the straight sections. Thus, conventional secondary containment methods have been inadequate in covering the entire fluid lines to adequately contain and remove hazardous fluids at the locations most likely to experience a leak.

A need, therefore, exists for a secondary containment method that covers all of the sections of the fluid line and for a line heating means that heats the fluid line uniformly from the fluid source or hot box to the process chamber.

SUMMARY OF THE INVENTION

A vacuum processing system has a process chamber mounted to a centralized transfer chamber and a primary fluid line for delivering a process fluid to the process chamber from a source of the process fluid. A secondary containment line surrounds the primary line for substantially all of the length of the primary line. A gas, or fluid, such as nitrogen, flows through the secondary containment line and around the primary containment line. This gas purges any of the process fluid that may have escaped from the primary fluid line. The purge gas carries the process fluid to an appropriate handling facility for safe disposal of the process fluid. The purge gas may also be heated. The heated gas heats the primary line, and the process fluid as it flows therethrough, and flows away any leaked process fluid. Since the heated gas is constantly flowing around the primary line, the heat is distributed evenly along each section of the primary line and the joints therebetween.

The heated gas may lose heat through the shell of the secondary containment line as the heated gas flows away from its inlet port to its outlet port. Thus, the process fluid will be heated through a temperature gradient. The gradient may be increasing or decreasing depending on the placement of the inlet port and the outlet port for the heated gas. Alternatively, a heating element, such as heating tape, may be wrapped around the secondary containment line to add additional heat to the heated gas. As the heated gas loses heat as it flows through the secondary containment line, the heating element may add heat so that there is no temperature gradient, or so that there is an increasing temperature gradient. Thus, the temperature range experienced by the process fluid may be very tightly controlled.

The shell of the secondary containment line includes a series of interlocking sections that conform to the shape of the fluid delivery lines. The straight sections are essentially cylindrical in shape with openings at both ends, but with a longitudinal opening extending between both end openings. A section of secondary containment line fits loosely over a partially assembled primary containment line through the longitudinal opening. Another section of secondary containment line fits around the primary containment line on the opposite side from the first section and slides or snaps through the longitudinal opening of the first section. Thus, the two sections together form a fully cylindrical pipe section assembly around the primary containment line. Any cracks or holes between sections may be covered with tape or filled with caulk. Support braces placed every few inches along the primary containment line serve as spacers to separate the secondary line shell from the primary line, so that the heated gas has space to flow all around the primary containment line.

The various secondary line section assemblies covering the various fitting and other discontinuities in the primary line are formed with the same basic structure as the straight section assemblies. For example, an angled section assembly is formed from essentially two pieces of straight section attached at an angle with their longitudinal openings facing each other on the acute side of the angle. Two regular straight sections cover the longitudinal openings of the angled sections. An intersection assembly includes two regular straight sections, one of which has a circular opening cut on a side opposite its longitudinal opening and fitted with a short, fully-cylindrical piece to form a T-section. The other straight section inserts into the longitudinal opening of the T-section, and the short cylindrical piece may receive another section assembly. A valve section assembly for covering a valve in the primary line includes the same or similar T-section as for the intersection assembly, but with a cylindrical cover over the short cylindrical piece that can be removed to access the valve. Additionally, a small hole in the cover provides a pneumatic control line input.

In another embodiment, a heat trace has a shell enclosing the process fluid delivery line and conforming to the outer surface of the fluid delivery line so that it is in thermally conductive contact therewith. The shell is formed from two half-shell sections with flanges at their mating surfaces for applying a fastener to hold the two half-shell sections together. Each half-shell section is sufficiently thick for a series of longitudinal holes to be formed therethrough. A plurality of cable heaters, such as resistive wires, disposed through some or all of the longitudinal holes, extend along the length of the heat trace. A controller provides precise temperature control for the cable heaters. Optionally, one or more temperature measurement devices, such as thermocouples, are disposed through one or more of the longitudinal holes at periodic locations to provide temperature feedback readings to the controller, so the controller can adjust the temperature of the cable heaters to a desired temperature. This embodiment can provide very tight control over the temperature of the fluid delivery line.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 2A:
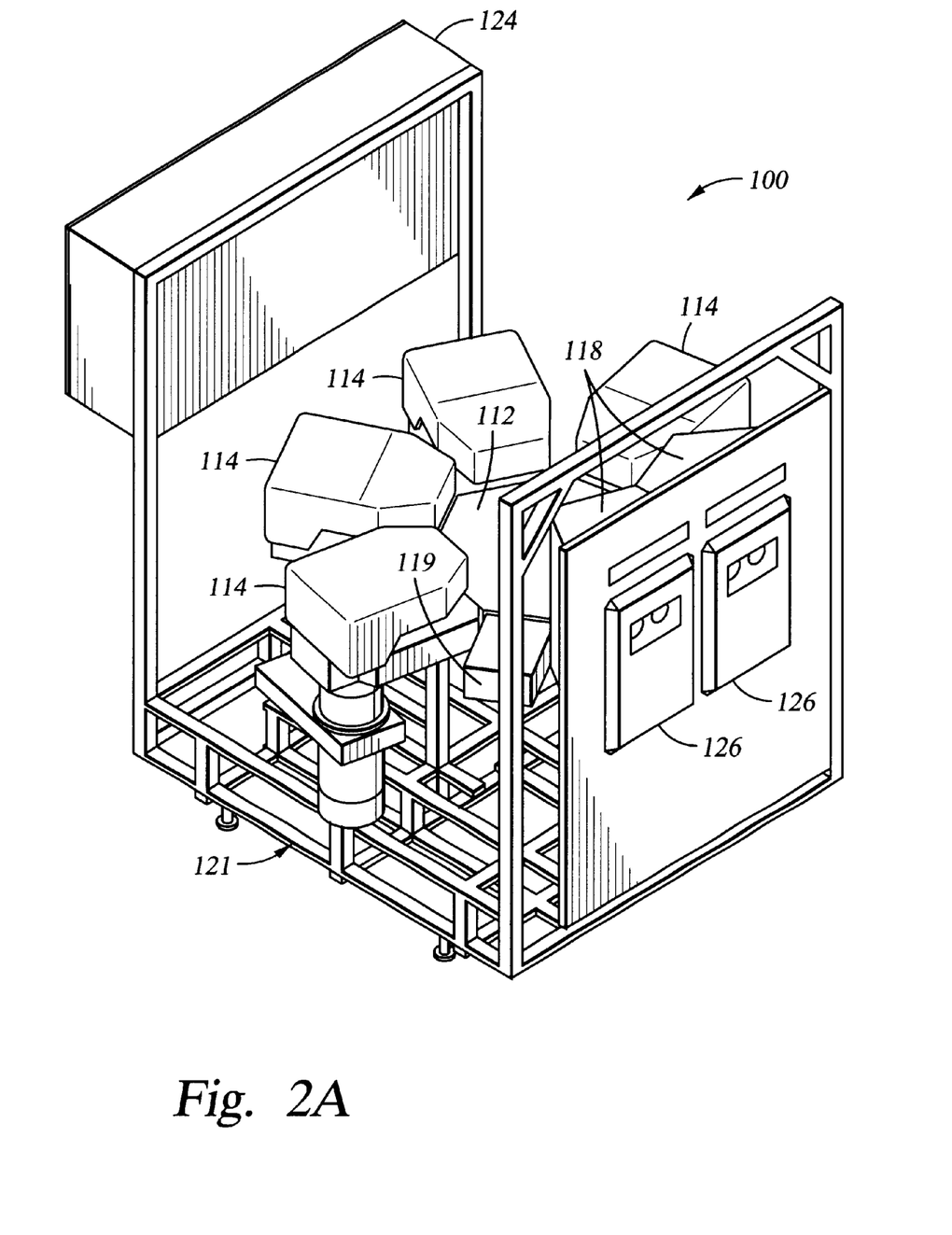
FIG. 2a is a perspective view of a vacuum processing system.
Figure 2B:
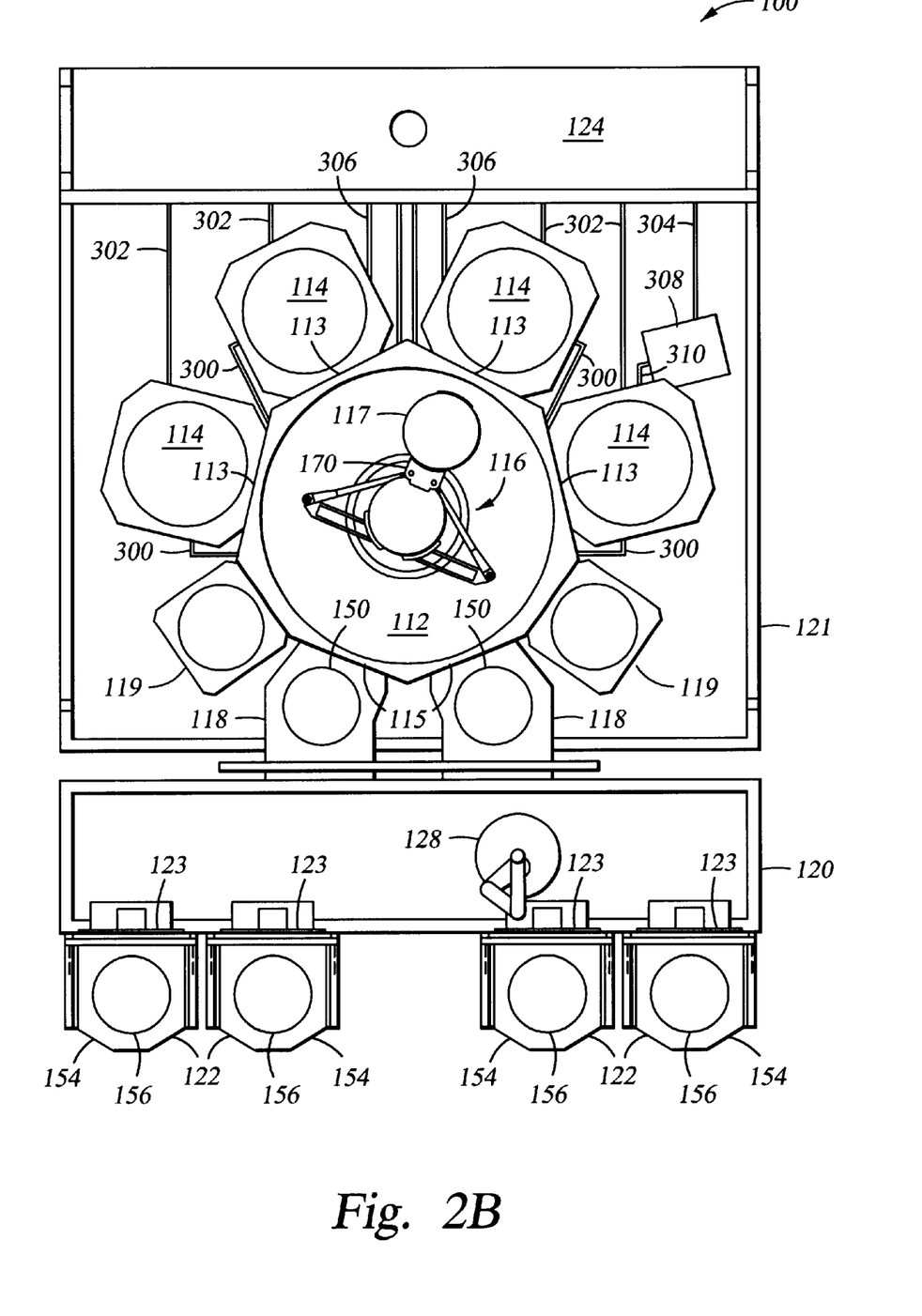
FIG. 2b is a schematic top view of a vacuum processing system.

FIGS. 2a and 2b show two configurations for an embodiment of a vacuum processing system 100 of the present invention. The vacuum processing system 100 and its function will be described in detail below. Generally, the vacuum processing system 100 includes a transfer chamber 112, one or more process chambers 114, one or more load lock chambers 118, one or more expansion or cool-down chambers 119, a platform frame 121, a gas panel 124 and an optional wafer handling chamber 120, referred to herein as the mini-environment. Some of the processes that a vacuum processing system 100 may perform on a substrate, or wafer, in the process chambers 114 require the use of process fluids, so the process chambers 114 have fluid lines 300, 302, 304, 306, 310 for delivering the process fluids to the process chambers 114 from the gas panel 124. The gas panel 124 receives the process fluids in either liquid or gaseous state, depending on the characteristics of the process fluid, from a source in the manufacturing facilities and typically converts the process fluids into a gaseous state for delivery to the process chambers 114. The process fluids are converted to a gaseous state before delivery to the process chambers 114 because most of the processes performed on the substrates require that the process fluid be in vapor form.

The fluid lines 300 are shown (FIG. 2b) as disposed within the system monolith in a path from the process chambers 114 under the transfer chamber 112 to a set of input fluid lines 306 that extend to the gas panel 124. The fluid lines 302 are shown as disposed in a more direct path from the process chambers 114 to the gas panel 124. The fluid line 304 extends from the gas panel 124 to a vaporizer 308 next to a process chamber 114, and fluid line 310 extends from the vaporizer 308 to the process chamber 114. It is to be understood that other configurations for the pathways of the fluid lines are within the scope of the present invention, including a pathway separate from the system 100 that extends directly to the process fluid sources of the manufacturing facilities.

Many of these process fluids have a temperature range within which they may be used, so they require a uniform heat trace system to maintain the fluid lines 300, 302 within the temperature range. Also, many of these process fluids are hazardous and can cause considerable damage to people and/or property if leakage is not contained, so the fluid delivery lines 300, 302 require a secondary containment system for capturing leaked fluid. The uniform heat trace and secondary containment system will be described below.

In the process chamber 114, the wafer may be subjected to a vapor of one or more of several different process fluids, such as cupraselect, dimethylaluminumhydride (DMAH) or tetrakisdimethylaminotitanium (TDMAT), among others. Cupraselect is a metal organic molecule that may be used as a precursor in a chemical vapor deposition process. DMAH is an aluminum compound used to perform vapor deposition of aluminum onto a wafer. Likewise, TDMAT is a compound used to deposit a film of titanium nitride on a wafer. These process fluids are delivered to the process chambers 114 through fluid lines 300, 302.

Each of these process fluids, as well as other process fluids, has a temperature of vaporization above which the fluid is a vapor, but below which the fluid condenses into a liquid. Since the processes typically require that a vapor be used, the temperature of vaporization presents a minimum temperature at which the fluid may be delivered to the process chamber 114 to perform the process. Thus, the operation of the system 100 includes the maintenance of the temperature of the fluid lines 300, 302, and hence the process fluid, at a temperature above the vaporization temperature of the process fluid. A process fluid delivery system will be described with reference to FIGS. 3 through 13 that provides uniform heating for maintaining the fluid line temperature above the vaporization temperature.

Additionally, each of these process fluids, as well as other process fluids, has a temperature of decomposition below which the fluid remains stable, but above which the fluid decomposes into other molecules or its constituent elements. Thus, the temperature of decomposition presents a maximum temperature at which the fluid may be delivered to the process chamber 114 to perform the process. Thus, the operation of the system 100 also includes the maintenance of the temperature of the fluid lines 300, 302 and of the process fluid at a temperature below the decomposition temperature of the process fluid. The process fluid delivery system described below also provides for maintaining the fluid line temperature below the decomposition temperature.

As mentioned above, cupraselect has a vaporization temperature of about 75° C. and a decomposition temperature of about 85° C. Thus, cupraselect has a very narrow temperature range within which it must be maintained for proper delivery to and performance of a process that uses cupraselect. By comparison, DMAH has a vaporization temperature of about 40° C. and a decomposition temperature of about 180–200° C., and TDMAT has a vaporization temperature of about 50° C. and a decomposition temperature greater than about 300° C. Thus, these compounds present a fairly wide temperature range which is considerably less difficult to maintain than that of cupraselect. For those process fluids with a fairly large useful temperature range, it is generally fairly simple to maintain an entire fluid delivery line within the necessary temperature range. For those process fluids with a very narrow temperature range, however, very strict controls need to be applied to the fluid delivery lines to maintain the entire line within the temperature range. In these cases, it is sometimes necessary to make the fluid delivery lines as short as possible to minimize the length of delivery line that must be temperature controlled, so a vaporizer 308 may need to be placed very near the process chamber 114 and connected to the process chamber 114 with a very short fluid line 310. The heat trace systems described below provide the very tight controls for maintaining the temperature of a fluid delivery line within very narrowly defined limits.

EXAMPLE 1

Figure 3:
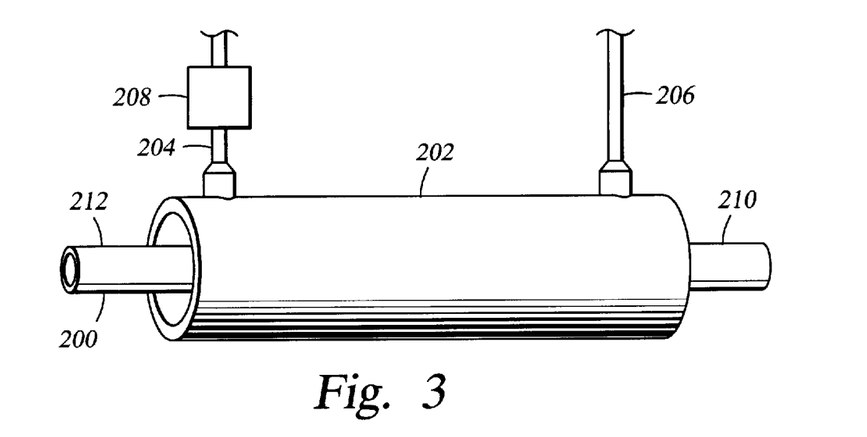
FIG. 3 is a side view of a fluid delivery system with a secondary containment line.

FIG. 3 shows a schematic of a fluid delivery line 200 longitudinally disposed within a secondary containment line 202. The fluid delivery line 200 is the primary containment line for the process fluid to be used in the system 100. The secondary containment line 202 captures any process fluid that may escape from the fluid delivery line 200, since many of the process fluids used in the various process chambers 104 may damage the area around the processing system 100 or are toxic to humans. If any of the process fluid leaks from any part of the fluid line 200, then a harmless purge gas, such as nitrogen or other nontoxic or inert gas, flowing through the secondary containment line 202 will carry the leaked fluid away and discharge it at the output 206. Nitrogen gas is an ideal fluid for use in the secondary containment line 202, because if it leaks out of the line 202 into the ambient environment, it will cause no harm since air is already primarily nitrogen. If the process fluid leakage is fairly small, then the secondary containment line 202 can easily manage to carry it safely away until the leak is detected and the system 100 is shut down to repair the fluid line 200. If the leakage is relatively large, then the leak will be detected quickly by the system's safeguards, and the system 100 can be shut down before the leakage rate exceeds the capacity of the secondary containment line 202 to discharge the process fluid. In an alternative embodiment, valves or other devices may be placed in the secondary containment line to permit quick connections for gas quality or temperature monitoring equipment to intercept the flow of gas and check the integrity of the secondary containment or the performance of the system 100.

Additionally, the purge gas may be heated. This heated fluid heats the fluid line 200 and, thereby, heats the process fluid. Fluid input, or inlet, 204 provides an incoming flow of heated fluid through the in-line gas heater 208 into the secondary containment line 202; and fluid output, or outlet, 206 provides a discharge flow of the heated fluid from the secondary containment line 202. Since the heated fluid flows from the input 204 to the output 206, the heating of the fluid line 200 is uniform throughout this distance, and no isolated cool spots can form in the fluid line 200.

The secondary containment line 202 may be fabricated from any sufficiently durable and structurally sound material, such as aluminum. However, aluminum or other good heat-conductive material will permit a loss of heat from the heated fluid as the heated fluid flows from the input 204 to the output 206. Thus, the process fluid will flow through a continuous temperature gradient. The temperature may be controlled with a single temperature controller monitoring the temperature at an appropriate location in the temperature gradient. The degree of the temperature gradient may be reduced by providing a layer of heat insulation (not shown) over the surface of the secondary containment line 202. Care must be taken to ensure that the amount of heat loss does not result in such cooling that the process fluid condenses and disrupts the operation of the system 100. If the process fluid flows from location 210, near the heated fluid output 206, to location 212, near the heated fluid input 204, then it will pass through an increasing temperature gradient. On the other hand, if it flows from the location 212 to the location 210, then it will pass through a decreasing temperature gradient. In order to ensure that the process fluid reaches the process chamber 104 as a vapor, it may be preferable to flow the process fluid through the increasing temperature gradient, so the process fluid will be properly heated by the time it reaches the process chamber 104.

Figure 4:
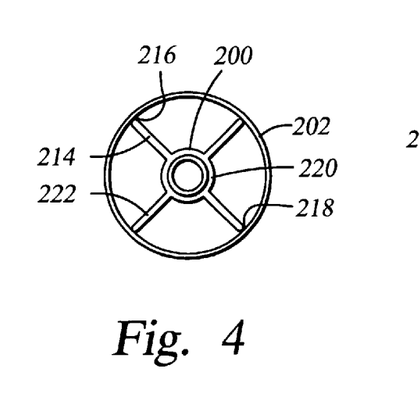
FIG. 4 is a cross sectional view of a primary containment line and a secondary containment line.

FIG. 4 shows a typical cross section of the fluid delivery system shown in FIG. 3. The primary containment line, or fluid line, 200 is shown approximately concentric with the secondary containment line 202. The spacer, or brace, 214 is a narrow strip of material, such as aluminum, with a hairpin bend at one end 216, an opening at the opposite end 218 and a circular bend 220 in the middle. The spacer 214 slips over the fluid line 200 at the open end 218 and slides until the middle circular bend 220 clamps onto the fluid line 200. The secondary containment line 202 slides over the spacer 214. Thereby, the spacer 214 holds the secondary containment line 202 apart from the fluid line 200. Another spacer 222 is placed onto the fluid line 200 at about a ninety degree angle from the first spacer 214 and a few inches down the fluid line 200 from the first spacer 214. In this manner, the spacers 214, 222 are placed on the fluid line 200 at intervals of a few inches. Typical installations of such a secondary containment line 202 do not require any additional support for the line sections, since the secondary containment line 202 is relatively lightweight, yet strong. Where necessary to ensure that the secondary containment line 202 will not be broken, however, braces may connect the secondary containment line 202 to a nearby support structure to provide structural stability.

Figure 5:
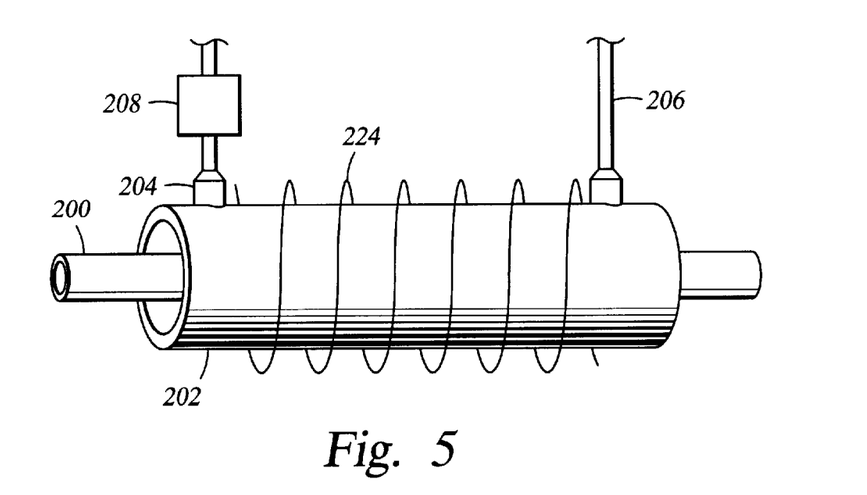
FIG. 5 is a side view of another embodiment of a fluid delivery system with a secondary containment line.
Figure 6:
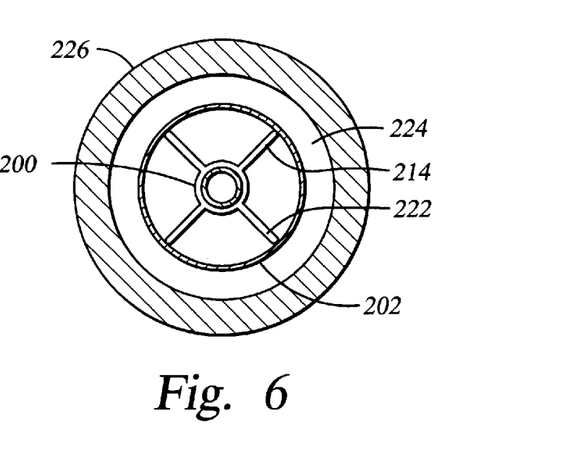
FIG. 6 is a cross sectional view of the embodiment shown in FIG. 5.

An alternative embodiment for a fluid delivery system is shown in FIG. 5. In this embodiment, the fluid line 200 is surrounded by the secondary containment line 202, which has a heated fluid input 204 and output 206 with an in-line gas heater 208. Additionally, a heating element 224 is wrapped around the secondary containment line 202. The heating element 224 may be any suitable heating device, including heating tape, and provides additional heat to the secondary containment line 202 and the heated fluid. A layer of insulation 226, such as shown in FIG. 6, may wrap around the heating element 224 to prevent heat loss. The controls for the heating element 224 may be varied in order to vary the temperature gradient. In this manner, the temperature gradient is controlled independently of the starting temperature at the input 204. The heating element 224 may merely decrease the temperature gradient of the heated fluid from the input 204 to the output 206 so that the temperature of the process fluid does not exceed its temperature range even with a long distance between the input 204 and the output 206. Alternatively, the heating element 224 may eliminate the temperature gradient so the process fluid is passed through a constant temperature or increase the temperature gradient so the heated fluid achieves a higher temperature as it flows through the secondary containment line 202. Thereby, the temperature gradient and the temperature range through which the process fluid passes may be very tightly controlled. Unlike the prior art method of using heating tape 22 to heat the primary fluid line 16 (FIG. 1b), the heating element 224 may be loosely applied to the secondary containment line 202 and still provide excellent temperature uniformity since the convection-heating of the flowing heated fluid smoothens any hot or cold spots that may result from uneven conductive heating of the heating element 224.

Figure 7A:
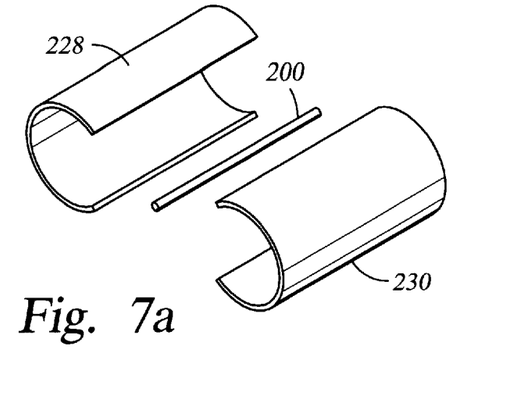
FIGS. 7a and 7b show the assembly of a straight section of a secondary containment line.
Figure 7B:
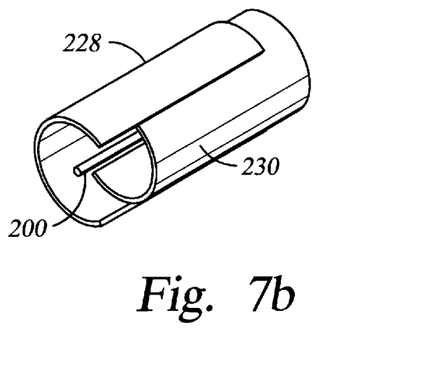

An assembly for a straight section of the secondary containment line 202 is shown in FIGS. 7a and 7b. The straight section of the secondary containment line 202 has a shell including two semicircular cylinders 228, 230 having a longitudinal opening extending the full length of the cylinder 228, 230 from end to end. The two cylinders 228, 230 fit together to form a fully cylindrical pipe section (FIG. 7b) by sliding or snapping one of the cylinders 230 into the longitudinal opening of the other cylinder 228. The longitudinal openings of each cylinder 228, 230 allow the inner cylinder 230 to flex inward and the outer cylinder 228 to flex outward, so the two cylinders 228, 230 fit together easily. Additionally, the longitudinal opening permits each cylinder 228, 230 to surround the fluid line 200 by merely placing the cylinder 228, 230 over the fluid line 200, even if the fluid line 200 is already fully assembled. Thus, the straight sections of the secondary containment line 202 may be assembled around a fully or partially assembled fluid line 200.

Figure 8A:
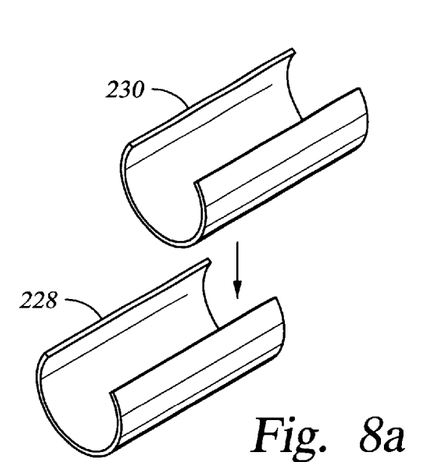
FIGS. 8a and 8b show the end-to-end assembly of two sections of secondary containment line.
Figure 8B:
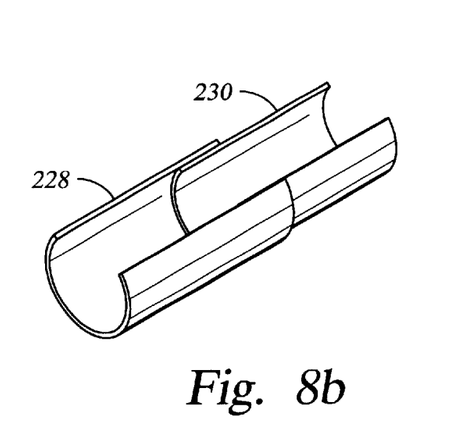

FIGS. 8a and 8b show a method for end-to-end assembly of a straight section of the secondary containment line 202. Two semicircular cylinder sections 228, 230 slide or snap together with only a small overlap. Other cylinder sections may close off the longitudinal openings of the cylinder sections 228, 230 to form a single pipe section. As many cylinder sections 228, 230 as needed may be used to make the pipe as long as needed to fully cover the long, straight sections of the fluid line 200. Any gaps between the cylinder sections in the assembly may be covered with tape or filled with caulk or other suitable material in order to seal the secondary containment line 202. Additionally, the secondary containment line sections may be assembled on-the-fly at the site of the processing system without the need to take detailed measurements of the fluid line 200 or prepare precut sections to precisely match the fluid line 200. Thus, assembly of the secondary containment line is very simple, quick and inexpensive.

Figure 9:
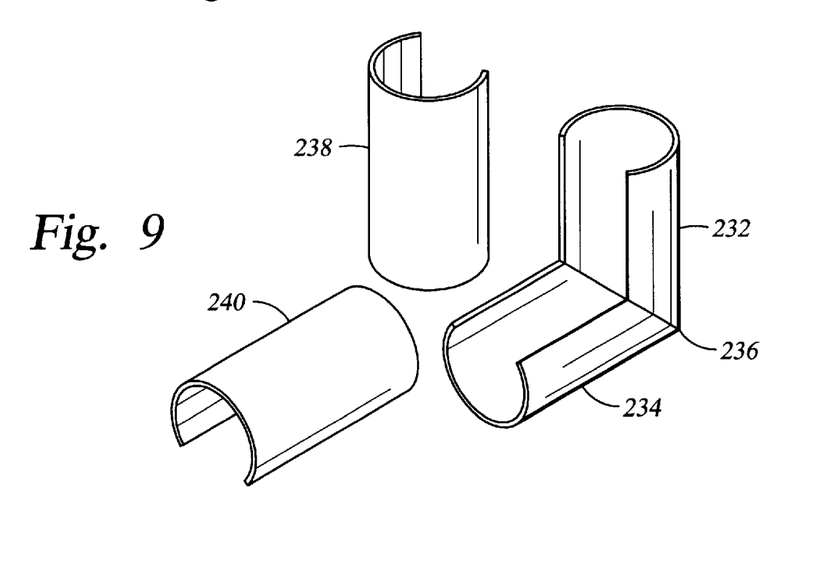
FIG. 9 shows the assembly of an angled section of a secondary containment line.

An assembly for an angled section of the secondary containment line 202 to cover an angled section of the fluid line 200 is shown in FIG. 9. Two sections of semicircular cylinders 232, 234 are joined together at the desired angle to form a corner 236. FIG. 9 depicts a ninety-degree angle section, but the cylinders 232, 234 may be joined at any angle. Two straight sections 238, 240 fit together over each cylinder 232, 234, respectively, of the angle section to form a complete angled pipe section, and the gaps are taped or caulked. Alternatively, the two straight sections 238, 240 may be cut to fit more closely together at an angle with small gaps therebetween, but since the gaps are appropriately covered or filled, this additional step is not necessary.

Figure 10:
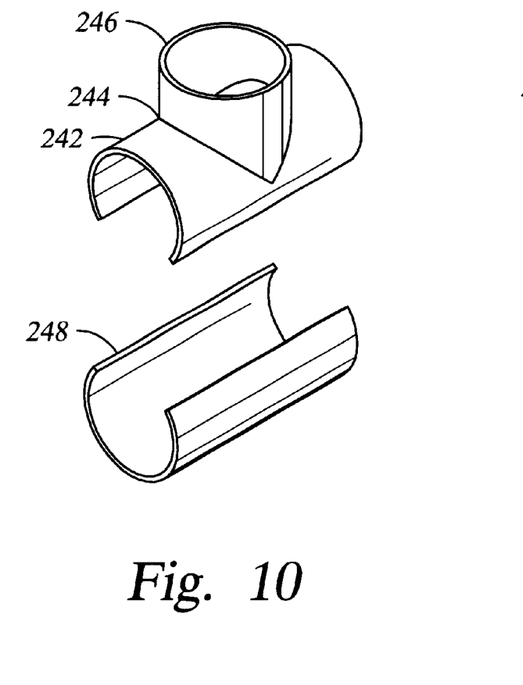
FIG. 10 shows the assembly of an intersection of a secondary containment line.

An assembly for an intersection between two lines of the secondary containment line 202 to cover a T-intersection of the fluid line 200 is shown in FIG. 10. A straight semicircular cylinder section 242 is cut with a circular opening 244 in the side opposite its longitudinal opening, and a fully circular pipe section 246 is cut to fit the opening 244 and joined to the straight section 242 by any appropriate means, such as welding, soldering or gluing. A straight cylinder section 248 is fit into the longitudinal opening of the straight section 242, and the gaps are covered or filled to complete the intersection pipe. Since the pipe section 246 does not have a longitudinal opening for placing the pipe section 246 over a fluid line 200, the intersection assembly 242, 246, 248 may have to be placed over a partially assembled fluid line 200.

Figure 11:
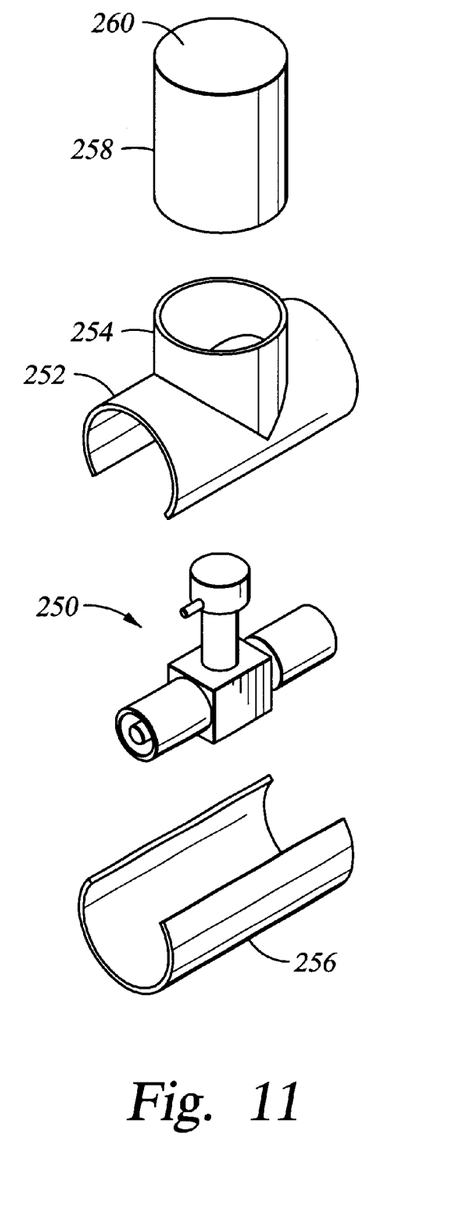
FIG. 11 shows the assembly of a valve section of a secondary containment line.

An assembly for a valve covering section of the secondary containment line 202 for covering a valve section 250 of the fluid line 200 is shown in FIG. 11. The valve section assembly 252, 254, 256 has a straight cylinder section 252 with an attached cylindrical pipe section 254 and another straight section 256, similar to the intersection assembly 242, 246, 248 shown in FIG. 10, but the cylindrical pipe section 254 is covered with a cylindrical covering 258. The cylindrical covering 258 may be removed to access the valve 250. The cylindrical covering 258 may also have a small hole 260 for a pneumatic control line input from the system 100 for controlling the valve 250.

EXAMPLE 2

Figure 12:
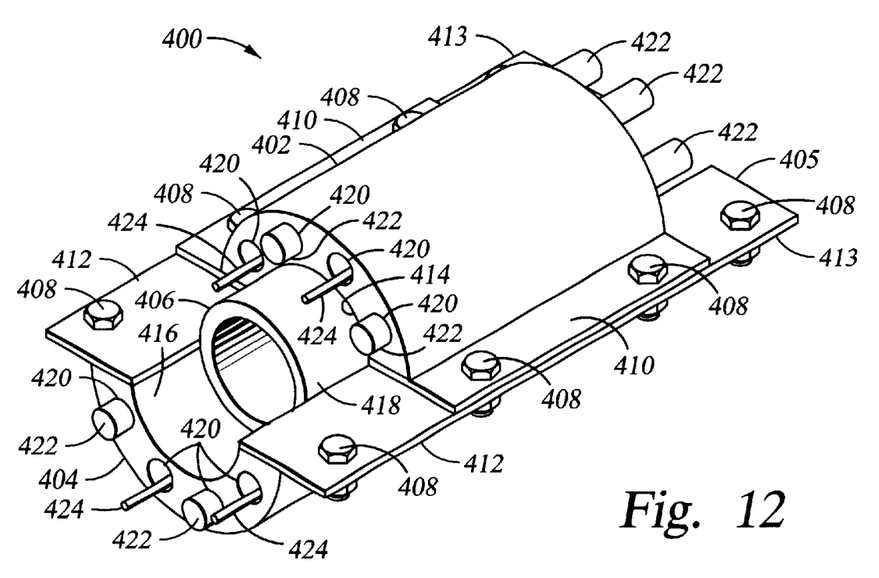
FIG. 12 shows a perspective view of an alternative embodiment for a heat trace.
Figure 13:
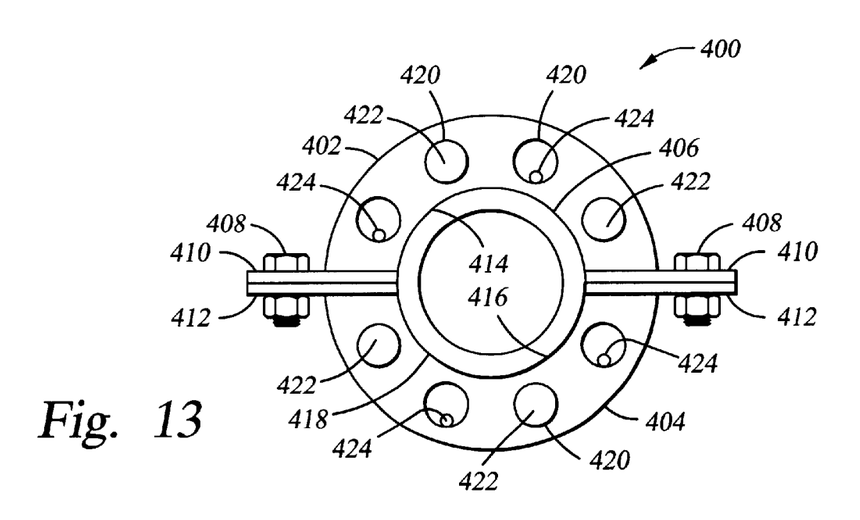
FIG. 13 shows a front view thereof.

Another embodiment for a uniform heat trace system 400 for maintaining the temperature of the fluid delivery lines 300–306, 310 is shown in FIGS. 12 and 13. The heat trace system 400 can provide a very tightly controlled temperature range and is especially useful with the short fluid delivery line 310 from the vaporizer 308 to the process chamber 114. Since some process fluids have a very narrow useful temperature range, it may be necessary to locate a vaporizer 308 on or near a process chamber 114 and provide a very short delivery line 310 therebetween. The vaporizer 308 converts the process fluid into the gaseous state within the very narrowly defined temperature range. The shortness of the delivery line 310 minimizes the opportunity for cool spots or hot spots to form in the line 310. Additionally, the heat trace system 400 tightly regulates the temperature of the fluid delivery line 310.

The heat trace system 400 includes a top shell 402 and a bottom shell 404 for surrounding a fluid delivery line 406. The top and bottom shells 402, 404 conform to the outer surface of the fluid delivery line 406, so that the inner surfaces 414, 416 of the shells 402, 404 are in thermal conductive contact with the outer surface 418 of the fluid delivery line 406 to transfer heat to the fluid delivery line 406 and the process fluid flowing therethrough. The top and bottom shells 402, 404 have flanges 410, 412, respectively, extending outwardly at their mating surfaces to permit the top shell 402 and bottom shell 404 to be joined together by appropriate fasteners 408, such as screws, disposed through the flanges 410, 412. Shells for surrounding valves, angle, intersections and other irregular line sections in a fluid delivery line are shaped to conform to the outer surface of those sections.

The top and bottom shells 402, 404 have a plurality of longitudinal holes 420 disposed fairly evenly around the perimeter of the shells 402, 404. A plurality of cable heaters, or heater lines, 422 are disposed through some or all of the longitudinal holes 420 and provide heat for the heat trace system 400. The cable heaters 422 may be any appropriate type of heater, such as an electrically resistive cable which generates heat when an electrical current flows therethrough. The cable heaters 422 are connected to a controller, such as a microprocessor controller or personal computer system, which adjusts the current flowing through the cable heaters 422 to increase or decrease the amount of heat generated by the cable heaters 422. The heat from the cable heaters 422 is conducted through the shells 402, 404 to the fluid delivery line 406 and the process fluid flowing therethrough to maintain the temperature of the process fluid. In an alternative embodiment, the longitudinal holes 420 contain a flowing heated fluid, either liquid or gas, which heats the fluid delivery line 406.

Optionally, a series of thermocouples 424, or other suitable device for measuring temperature, are disposed through one or more of the longitudinal holes 420 for detecting the temperature in the heat trace system 400. The thermocouples 424 connect to the controller to provide feedback to the controller regarding the temperature generated by the cable heaters 422. In this manner, the controller is able to monitor and regulate the temperature of the heat trace system 400 by adjusting the current through the cable heaters 422 higher or lower depending on the temperature feedback received from the thermocouples 424. Since the shells 402, 404 are in thermally conductive contact with the fluid delivery line 406, the controller is able to maintain the temperature of the fluid delivery line 406 within a very narrow temperature variance.

In one embodiment, the cable heaters 422 are continuous throughout their length from the beginning of the fluid delivery line 406 to its termination. In another embodiment, for ease in assembling the heat trace system 400, each cable heater 422 and shell 402, 404 is divided into sections. The shell sections may be joined together in any appropriate manner, including overlapping bottom shell sections 404, 405 with top shell section 402, so that each top shell section 402 connects to the flanges 412, 413 of two bottom shell sections 404, 405, and each bottom shell section 404, 405 connects to the flanges 410 of two top shell sections 402. The sections of the cable heaters 422 extend into each of the shell sections 402, 404, 405 and connect with electrical connectors at each end, so that the current flows through each cable section.

In an alternative embodiment, each cable heater 422 is divided into short cable segments for heating individual segments of the shells 402, 404 and fluid delivery line 406. Each cable segment is individually controllable by the controller. Additionally, each segment is monitored by one or more thermocouples 424 providing feedback to the controller regarding the temperature in the heat trace system 400 at the cable segment. Thereby, the controller can maintain tight control over the temperature of particular sections of the fluid delivery line 406, such as valves, angles or other irregularities, by detecting cool spots and hot spots in isolated locations and adjusting the temperature in the corresponding cable segment accordingly.

The System

Referring back to FIG. 2, a vacuum processing system incorporating the above described secondary containment and heat trace apparatuses and methods will now be described. FIG. 2a generally shows a perspective view of a vacuum processing system 100. FIG. 2b generally shows a schematic top view thereof. As mentioned briefly above, the vacuum processing system 100 includes a centralized transfer chamber 112 as the center of activity in the handling of wafers, or substrates, through the system 100. The transfer chamber 112 typically mounts on a platform 121. The transfer chamber 112 has process chambers 114 attached at facets 113. The process chambers 114 may be any type of process chamber, such as a physical vapor deposition chamber, a chemical vapor deposition chamber, an etch chamber, etc. It is not uncommon for a manufacturer of process chambers to provide over twenty different types of process chambers. The process chambers 114 may be supported by the transfer chamber 112, by the platform 121 or on their own platforms, depending on the configuration of the individual process chambers 114. Slit valves (not shown) in the facets 113 provide access and isolation between the transfer chamber 112 and the process chambers 114. Correspondingly, the process chambers 114 have openings (not shown) on their surfaces that align with the slit valves.

As described in more detail above, the system 100 includes a gas panel 124 connected to the process chambers 114 through the fluid lines 300–306 for delivering process fluids to the process chambers 114 or a vaporizer 308. The gas panel 124 connects to a source of the process fluids in the manufacturing facility, and typically delivers the process fluids in a gaseous state to the process chambers 114.

The transfer chamber 112 also has two load lock chambers 118 mounted at facets 115. Openings (not shown) in the facets 115 provide access and isolation between the load lock chambers 118 and the transfer chamber 112. Correspondingly, the load lock chambers 118 have openings on their surfaces that align with the openings in facets 115. The load lock chambers 118 are attached to mini-environment 120. The load lock chambers 118 and the mini-environment 120 have corresponding openings (not shown) providing access therebetween, while doors 126 for the openings provide isolation. The mini-environment 120 has four pod loaders 122 attached on its front side. Openings (not shown) with corresponding doors 123 provide access and isolation between the mini-environment 114 and the pod loaders 122. The pod loaders 122 are essentially shelves for supporting wafer pods, or cassettes, 154 containing wafers 156 to be processed in the system 100.

In operation, the wafer pods 154 containing wafers 156 to be processed in the system 100 are placed on the top of the pod loaders 122. Then a mini-environment robot 128 begins removing the wafers out of the wafer pods 154 and into one of the load lock chambers 118. After all of the wafers have been loaded into the load lock chamber 118, the pressure in the load lock chamber 118 is reduced to match that in the transfer chamber 112. A transfer chamber robot 116 begins servicing the load lock chamber 118. The transfer chamber robot 116 moves the wafers 150 from the load lock chamber 118 to one of the process chambers 114 for processing. The gas panel 124 flows the process fluids through the fluid delivery lines 300–306 to the process chambers 114. The secondary containment system and uniform heat trace maintain the temperature of the fluid delivery lines 300–306, 310 and of the process fluids within the prescribed temperature range. The process chambers 114 receive the vapor of the process fluid and perform the deposition, etch or other process on the wafers. After the performance of the process in the process chamber 114, the transfer chamber robot 116 moves the wafers back to one of the load lock chambers 118. When the load lock chamber 118 full of processed wafers, the pressure in the load lock chamber 118 is returned to that of the mini-environment 120, so the mini-environment robot 128 can move the processed wafers back to a wafer pod 154.

While the foregoing is directed to the preferred embodiment of the present invention, other and further embodiments of the invention may be devised without departing from the basic scope thereof, and the scope thereof is determined by the claims which follow.

What is claimed is:

1. A method of assembling a vacuum processing system, comprising:
    providing a transfer chamber;
    providing a process chamber mounted on the transfer chamber;
    attaching a primary containment line to the process chamber, the primary containment line including line sections selected from the group consisting of straight sections, angled sections, intersections and valve sections, wherein the primary containment line comprises:
        a fluid line attached to the process chamber and to a fluid source that delivers a process fluid to the process chamber;
        a heating fluid containment line within which the fluid line is disposed;
        a heating fluid input to the heating fluid containment line;
        a heating fluid output from the heating fluid containment line; and
        a heating element attached to at least part of the heating fluid containment line; and
    assembling a secondary containment line around the primary containment line, the secondary containment line enclosing substantially all of the line sections.

2. The method of claim 1, wherein the heating element is a preheater connected to the heated fluid input of the containment line.

3. The method of claim 1, wherein the heating element is heating tape.

4. The method of claim 1, wherein the heating fluid containment line covers the fluid line along sections of the fluid line having a valve protruding therefrom.

5. The method of claim 4, wherein the heating fluid containment line includes a valve cover for providing access to and containment of the valve.

6. The method of claim 1, further comprising:
    heating the process fluid in an increasing temperature gradient through at least part of the fluid line as the process fluid flows from the fluid source to the process chamber.

7. The method of claim 6, further comprising:
    flowing a heating fluid into the heating fluid containment line at the processing chamber; and
    flowing the heating fluid out of the heating fluid containment line at the fluid source location;
    whereby the increasing temperature gradient is caused by cooling of the heating fluid as it flows from the processing chamber second location to the fluid source location.

8. The method of claim 1, further comprising:
    heating the process fluid in a decreasing temperature gradient through at least part of the fluid line as the process fluid flows from a fluid source to a processing chamber.

9. The method of claim 8, further comprising:
    flowing the heating fluid into the secondary containment line at the first location; and
    flowing the heating fluid out of the secondary containment line at the second location;
    whereby the decreasing temperature gradient is caused by cooling of the heating fluid as it flows from the first location to the second location.

10. The method of claim 1, further comprising heating at least part of the heating fluid containment line with a heating element.

11. The method of claim 10, wherein the heating element heats the heating fluid containment line for the purpose of maintaining the heating fluid at a substantially constant temperature and the process fluid is heated at a substantially constant temperature as the process fluid flows through the fluid line.

12. The method of claim 10, wherein the heating element heats the secondary containment line for the purpose of increasing the temperature of the heating fluid as it flows through the secondary containment line and the process fluid is heated in a temperature gradient.

13. The method of claim 10, wherein the heating element includes heating tape attached to the heating fluid containment line.

14. The method of claim 1, wherein the step of assembling the secondary containment line further comprises:
    placing a first pipe section over the primary containment line, the first pipe section having a first end opening, a second end opening, and a longitudinal opening extending from the first end opening to the second end opening; and
    inserting a second pipe section into the first pipe section to form a pipe enclosing at least part of the primary containment line, the second pipe section having a first end opening, a second end opening and a longitudinal opening extending from the first end opening to the second end opening.

* * * * *